US011146190B2

(12) United States Patent
Prokop

(10) Patent No.: US 11,146,190 B2
(45) Date of Patent: Oct. 12, 2021

(54) MULTIPHASE SYNCHRONOUS MOTOR CONTROLLER WITH ANGLE TRACKING

(71) Applicant: NXP USA, INC., Austin, TX (US)

(72) Inventor: Libor Prokop, Brno (CZ)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/276,810

(22) Filed: Feb. 15, 2019

(65) Prior Publication Data

US 2019/0305700 A1 Oct. 3, 2019

(30) Foreign Application Priority Data

Apr. 3, 2018 (EP) .................................... 18165548

(51) Int. Cl.
| | | |
|---|---|---|
| *G01B 7/30* | (2006.01) | |
| *H02P 6/182* | (2016.01) | |
| *H02P 25/089* | (2016.01) | |
| *G01R 27/26* | (2006.01) | |
| *H02P 6/16* | (2016.01) | |
| *H02P 6/185* | (2016.01) | |

(52) U.S. Cl.
CPC .......... *H02P 6/182* (2013.01); *G01R 27/2611* (2013.01); *H02P 6/16* (2013.01); *H02P 25/089* (2016.02); *H02P 6/185* (2013.01)

(58) Field of Classification Search
CPC .......... H02P 6/182; H02P 25/089; H02P 6/16; H02P 6/185; G01R 27/2611
USPC ....................................... 318/400.34, 400.35
See application file for complete search history.

(56) References Cited

U.S. PATENT DOCUMENTS

| | | | |
|---|---|---|---|
| 6,555,977 B1 | 4/2003 | Du et al. | |
| 8,040,095 B2 * | 10/2011 | Berto | ...................... H02P 6/182 |
| | | | 318/400.35 |
| 8,125,170 B2 | 2/2012 | Fahimi et al. | |

OTHER PUBLICATIONS

Samuel Wang, A 12 Step Sensorless Drive for Brushless DC motor Based on Back-EMF Differences, Jun. 2015, IEEE, vol. 30, No. 2, pp. 646-654 (Year: 2015).*
Freescale Semiconductor, Inc. Application Note, AN2356/D, Nov. 2002 "Sensorless BLDC Motor Control on MC68HC908MR32 Software Porting to Customer Motor;" PROKOP, Libor et al., 2004.
STMicroelectronics AN2009 Application Note PWM Management for 3-Phase Bldc Motor Drives Using the ST7MC, 2007.
(Continued)

*Primary Examiner* — Kawing Chan
*Assistant Examiner* — Zemenay T Truneh

(57) ABSTRACT

A method for controlling a multiphase synchronous motor, for a motor flux vector includes setting a first winding of the motor to a floating state in which the first winding is electrically floating; setting a voltage across a second winding of the motor for a first period; receiving first voltage samples associated with the first winding in the first period; setting the voltage across the second winding to a second period, in which the first period and the second period are periods of one or more pulse width modulation cycles, in which a polarity of the voltage across the second winding in the second period is opposite to a polarity of the voltage across the second winding in the first period; receiving second voltage samples associated with the first winding in the second period; and determining a position of the rotor based on the first and second voltage samples.

12 Claims, 12 Drawing Sheets

(56) References Cited

OTHER PUBLICATIONS

Matsuo, Takayoshi et al.; "Rotor Position Detection Scheme for Synchronous Reluctance Motor Based on Current Measurements;" IEEE Transactions on Industry Applications; vol. 31, Issue: 4, Jul./Aug. 1995; DOI: 10.1109/28.395297.

Wang, Samuel et al., "A 12-Step Sensorless Drive for Brushless DC Motors Based on Back-EMF Differences", IEEE Transactions on Energy Conversion; vol. 30, No. 2, Jun. 2015; DOI: 10.1109/TEC.2014.2370672.

* cited by examiner

MULTIPHASE SYNCHRONOUS MOTOR CONTROLLER WITH ANGLE TRACKING

CROSS-REFERENCE TO RELATED APPLICATIONS

This application claims priority under 35 U.S.C. § 119 to European Patent Application No. 18165548.1, filed on 3 Apr. 2018, the contents of which are incorporated by reference herein.

FIELD OF THE INVENTION

The disclosure relates to a controller for a multiphase synchronous motor, such as a Permanent Magnet Synchronous Motor (PMSM), Brushless Direct Current (BLDC), Switching Reluctance or Synchronous Reluctant motor, and in particular, although not exclusively to sensorless control during low speed operation of a multiphase synchronous motor having a rotor and a plurality of windings for receiving a plurality of stator flux vectors.

BACKGROUND

In order to efficiently control a synchronous motor, the timing of application of signals to the windings of the motor need to be suitably controlled.

Some examples herein relate to an improved method for determining the position of the rotor for controlling position related control signals timing of a motor.

SUMMARY

According to a first aspect of the present disclosure there is provided a controller for a multiphase synchronous motor with a rotor and a plurality of phases for receiving a plurality of motor control vectors, the controller configured to, for a motor flux vector:
  set a first phase of the motor to a floating state in which the first phase is electrically floating;
  set a voltage across a second phase of the motor for a first period;
  receive first voltage samples associated with the first phase in the first period;
  set the voltage across the second phase of the motor to a second period, in which the first period and the second period are periods of one or more pulse width modulation cycles, in which a polarity of the voltage across the second phase in the second period is opposite to a polarity of the voltage across the second phase in the first period;
  receive second voltage samples associated with the first phase in the second period; and
  determine a position of the rotor based on the first and second voltage samples.

One or more windings may be associated with each phase. A motor flux vector may also be referred to as a motor control vector or a motor step vector. The first period and the second period may be consecutive or non-consecutive periods. The first period and the second period may be different periods within the same PWM cycle. The first period may encompass a plurality of periods in different PWM cycles. The second period may encompass a plurality of periods in different PWM cycles.

In one or more embodiments, the position of the rotor is determined based on a difference between the first and second voltage samples. The determined difference may be a scalar quantity, a continuous variable or non-Boolean.

In one or more embodiments, a plurality of first voltage samples and a plurality of second voltage samples are obtained from a single pulse width modulation cycle.

In one or more embodiments, the controller is configured to filter the first voltage signals and the second voltage signals in order to compensate for mutual capacitance effects. The position may be determined in accordance with a mutual indicated between the first and second phases.

In one or more embodiments, the position of the rotor is determined based on the first harmonic of the difference between the first voltage samples and the second voltage samples.

In one or more embodiments, which the position of the rotor is determined based on an identity of the phase that is in the floating period. The difference between the the first and second voltage samples may be scaled in accordance with a power stage DC voltage and/or a motor current amplitude.

In one or more embodiments, the controller is configured to determine the position of the rotor a plurality of times during the application of a single motor flux vector.

In one or more embodiments, the determined position takes the value of a continuous variable or is a scalar quantity.

In one or more embodiments, the controller is configured to commutate the motor from a first vector to a second vector so that the second phase is set to the floating period and a third phase is set to the first and second periods. The controller may be configured to receive first and second voltage samples from the second phase. The controller may be configured to determine the position of the rotor based on the first and second voltage samples from the second phase.

In one or more embodiments, the controller is configured to, when commutating the motor from the first vector to the second vector, apply a gradual transition between the first and second vectors. The controller may be configured to, when commutating the motor from one vector to another vector, apply a transition between the vectors. The transition between the vectors may be one or more of sinusoidal, linear or non-asymptotic.

In one or more embodiments, the controller is configured to, on initialization of the motor: apply three vectors; determine a position of the rotor; determine a direction of travel of the motor; and apply a 180 degree correction to the position of the rotor if the determined direction of travel opposes an expected direction of travel.

In one or more embodiments, the controller is not configured to inject a high frequency signal onto a phase in order to measure an induced signal on another phase. A high frequency signal may be at a frequency greater than the commutation frequency of the motor.

According to a further aspect, there is provided a multiphase synchronous motor circuit comprising: a multiphase synchronous motor; and a controller circuit comprising: a plurality of switches for setting periods of respective phases of the multiphase synchronous motor; and the controller of any preceding claim.

According to a further aspect there is provided a method for controlling a multiphase synchronous motor with a rotor and a plurality of phases for receiving a plurality of motor vectors, the method comprising, for a motor flux vector:
  setting a first phase of the motor to a floating state in which the first phase is electrically floating;
  setting a voltage across a second phase of the motor for a first period;

receiving first voltage samples associated with the first phase in the first period;

setting the voltage across the second phase of the motor to a second period, in which the first period and the second period are periods of one or more pulse width modulation cycles, in which a polarity of the voltage across the second phase in the second period is opposite to a polarity of the voltage across the second phase in the first period;

receiving second voltage samples associated with the first phase in the second period; and determining a position of the rotor based on the first and second voltage samples.

According to a further aspect there is provided a computer program configured to enable a processor, and optionally memory, to perform any method described herein.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The Figures and Detailed Description that follow also exemplify various example embodiments. Various example embodiments may be more completely understood in consideration of the following Detailed Description in connection with the accompanying Drawings.

BRIEF DESCRIPTION OF THE FIGURES

One or more embodiments will now be described by way of example only with reference to the accompanying drawings in which.

DETAILED DESCRIPTION

Figure 1A:
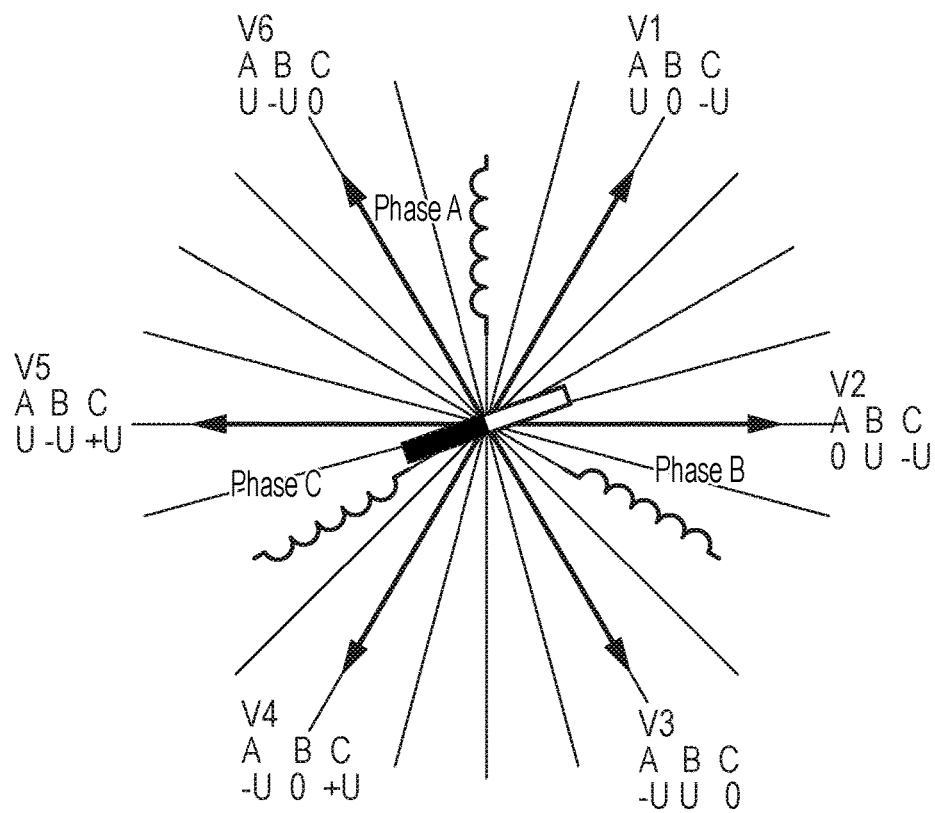
FIG. 1a illustrates a stator current and stator flux vector diagram for a three-phase synchronous motor.

FIG. 1a illustrates a stator flux vector diagram for six step control of a three-phase synchronous motor. A rotor of the motor has a magnetic dipole that is free to rotate in response to a magnetic field applied by the three driving stator windings of the motor: phase A, phase B and phase C. Signals can be applied to the three phases such that the rotor is attracted to be aligned with one of six vectors. In use, the phases are controlled in response to the rotation of the rotor to maintain an angular shift between the current presently applied vector and the position for the rotor. In this way the torque applied to the rotor may be improved or maximised. The stator flux vector may be controlled to be shifted from the rotor flux by 60 to 120 degrees, in order to get optimal torque.

Figure 1B:
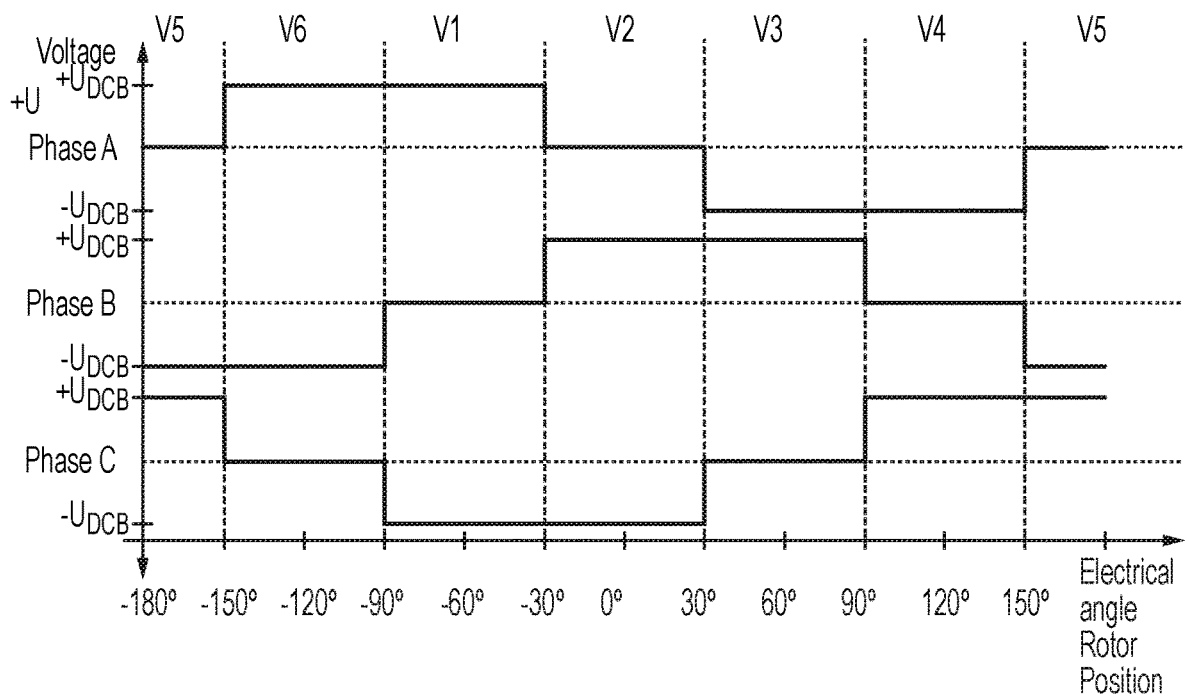
FIG. 1b illustrates a voltage against electrical angle diagram for a three-phase brushless DC motor during application of six step a stator flux vectors.

FIG. 1b illustrates a voltage against electrical angle (rotor position) diagram for each of phase A, phase B and phase C during application of each of the six vectors. At any one time, one of the phases has a positive voltage with respect to another of the phases, and a third of the phases is floating. In this way, the three phase motor system adopts one of six flux vectors, or sectors.

In the example illustrated in FIG. 1b, during application of a first vector V1 (between −90° and −30°), phase B is floating, phase C is at a negative voltage −U and phase B is at a positive voltage +U. During application of a second vector V2 (between −30° and +30°), phase B is at a positive voltage +U, phase C is at a negative voltage −U and phase A is floating. During application of a third vector V3 (between +30° and +90°) phase B is at a positive voltage +U, phase C is floating and phase A is at a negative voltage −U. During application of a fourth vector V4 (between +90° and +150°), phase B is floating, phase C is at a positive voltage +U and phase A is at a negative voltage −U. During application of a fifth vector V5 (between +150° and −150°), phase B is at a negative voltage −U, phase C is at a positive voltage +U and phase A is floating. During application of a sixth vector V6 (between −150° and −90°), phase B is at a negative voltage −U, phase C is floating and phase A is at a positive voltage +U.

Figure 2:
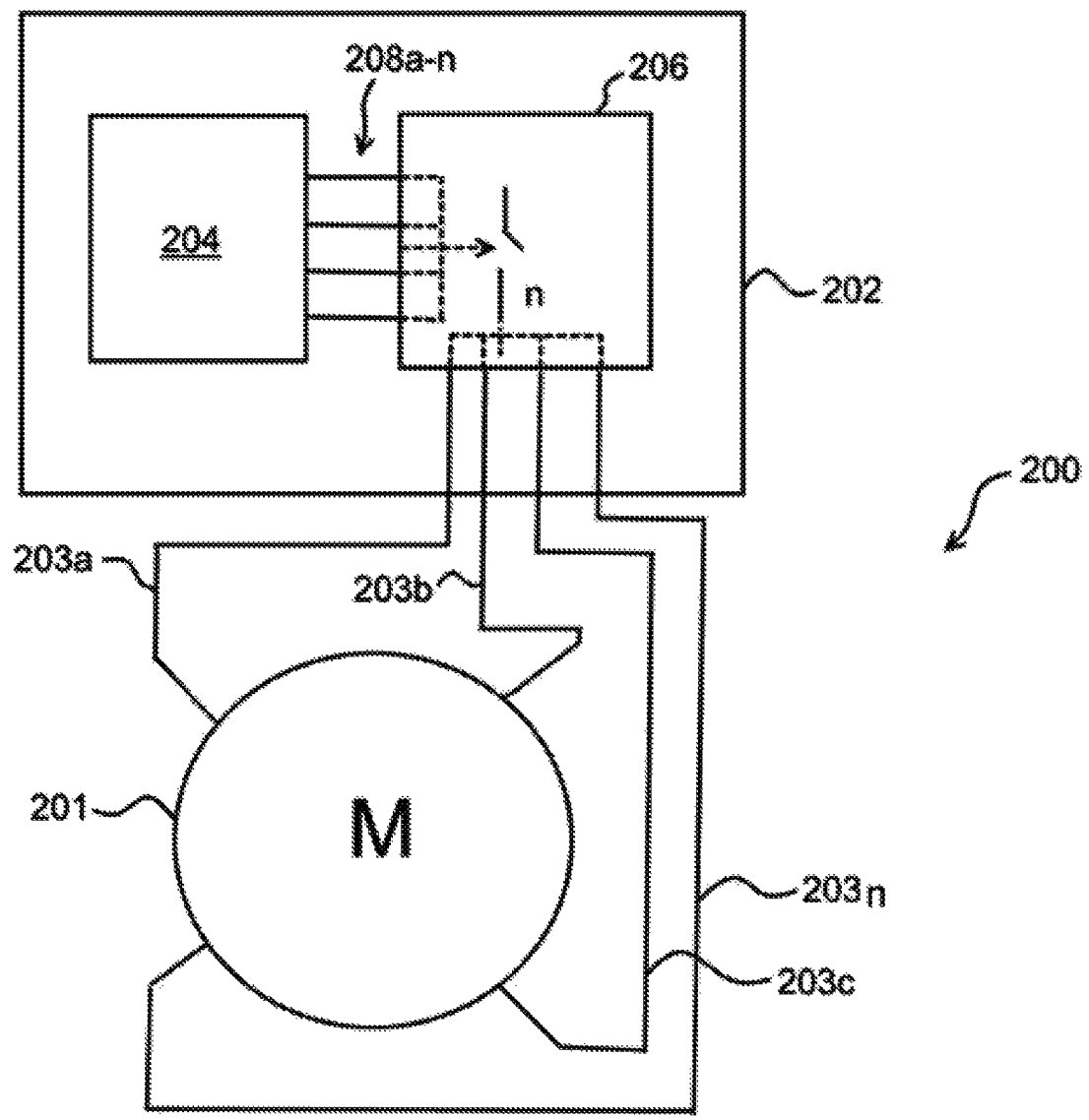
FIG. 2 is a schematic block diagram of a multiphase synchronous motor circuit.

FIG. 2 is a schematic diagram for a multiphase synchronous motor circuit 200. The multiphase synchronous motor circuit 200 comprises a multiphase brushless motor 201 and a controller circuit 202. The synchronous motor 201 can be implemented using a permanent magnet rotor with a plurality of stator windings. Typically, a 3-phase motor may be used, which can be operated according to a six vector scheme, such as that described previously with reference to FIGS. 1a and 1b. In the illustrated example, the motor 201 has more than three windings 203a-n.

The controller circuit 202 comprises a controller 204 and a switching circuit 206. The switching circuit includes a plurality of switches for setting a state of each respective winding of the multiphase synchronous motor 201. The state of the windings determines the vector that is applied to the motor. A control and sensing bus 208a-n is provided between the controller 204 and the plurality of switches of the controller circuitry 206. Each switch may have its own control channel on the control and sensing bus 208a-n. The controller 204 is configured to provide signals to control the plurality of switches via the control and sensing bus 208a-n.

Each winding of the motor 201 may be associated with respective first and second switches of the plurality of switches 206. Each switch of the plurality of switches may be provided by an electronic switch, such as a transistor. The transistor may be field effect transistor or a bipolar junction transistor with a reverse diode. The respective first switch may be arranged to controllably connect a first contact of the associated winding to a first power rail. The first switch may be arranged to controllably connect the first contact of the associated winding to a second power rail. The first power rail, which may be VCC for example, is at a different potential to the second power rail, which may be ground for example.

The controller 204 may be implemented using a general-purpose microprocessor, for example. Alternatively, the controller 204 may be implemented using dedicated circuitry. Typically, the controller 204 provides pulse width modulated signals to control the plurality of switches. In order to apply the correct voltage inducing a stator current and flux vector to efficiently produce torque, the controller 204 needs to be able to determine, at least periodically, an actual or predicted angular position of the rotor.

Sensorless control of synchronous motors requires estimation of rotor position for correct operation. In motor high speed control range, a substantial voltage 440 is induced on floating winding during application of PWM cycles to the driven windings of the motor. The back-EMF may be used to determine the position of the motor.

In the low speed range, the BEMF signal is neglectable and so other techniques are used, such as open loop start-up or salient based techniques. The cut-off between high and low speed range is usually 10% of motor nominal speed, or below.

Current injection may be used to induce a detectable position dependent signal. However current injection, results in acoustic noise and position estimation fails at high current (high load) due to motor magnetic circuit saturation.

Figure 5:
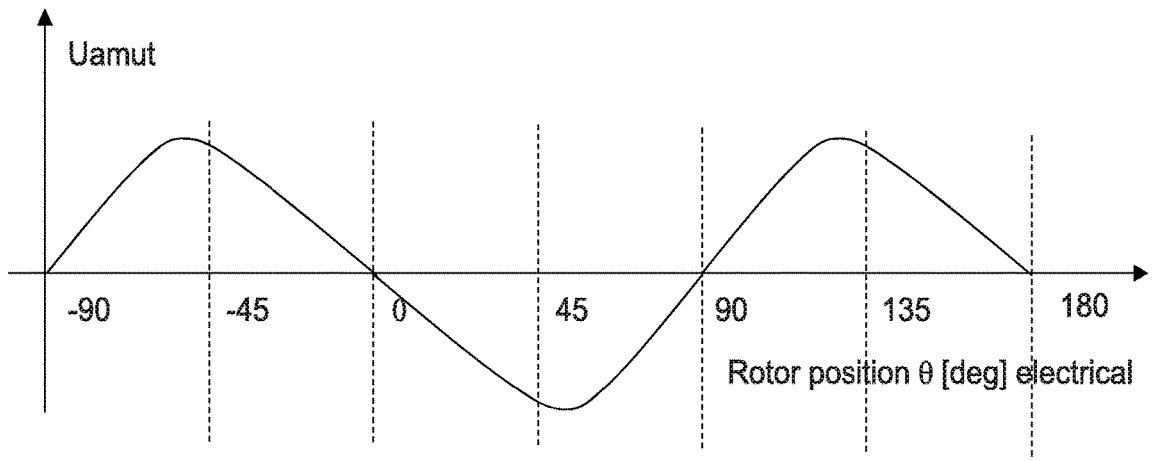
FIG. 5 illustrates an inductance position dependant signal as a function of rotor position.

Alternatively, a voltage of the floating winding may be monitored in order to determine when the voltage changes sign. This change in sign, or zero-crossing, has a fixed relationship with the position of the rotor. Since the zero-crossing information is only available periodically during a rotation cycle, use of the zero-crossing to determine the position of the rotor may result in stability problems at the low speed control due to the low sampling frequency. In some examples, the zero crossing is detectable four times per electrical revolution for any out of the six vectors (as illustrated in FIG. 5). However, due to commutations applied in some control schemes the zero crossing may be detected six times per electrical rotation—once per step vector.

Figure 3:
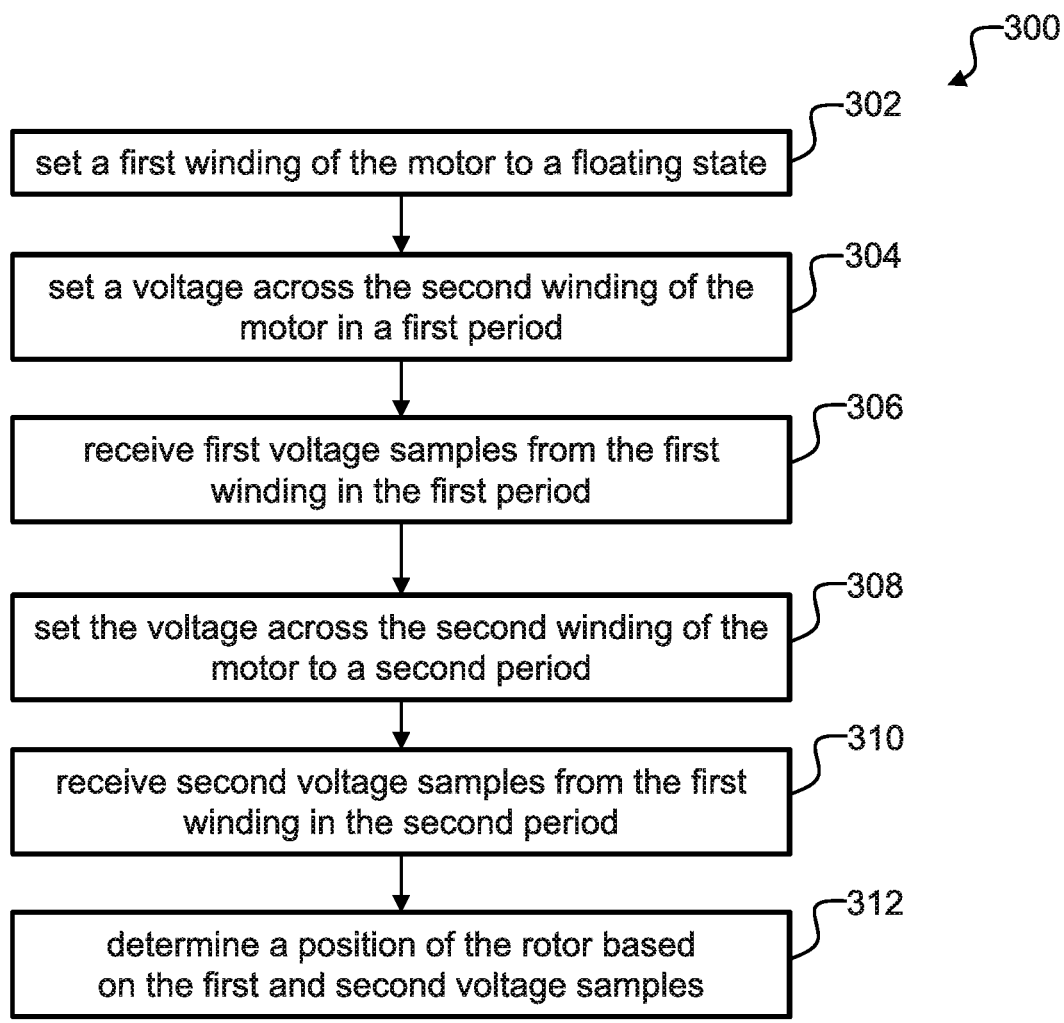
FIG. 3 illustrates a method of operating a controller for a multiphase brushless motor.

FIG. 3 illustrates a method 300 that may be implemented by a controller for a multiphase synchronous motor, or other synchronous motor, with a rotor and a plurality of windings for receiving a plurality of motor vectors, such as that described previously with reference to FIGS. 1a, 1b and 2.

The method 300 comprises, for a particular vector:

setting 302 a first winding of the motor to a floating state in which a first winding is electrically floating;

setting 304 a voltage across the second winding of the motor in a first period;

receiving 306 first voltage samples from the first winding in the first period;

setting 308 the voltage across the second winding of the motor to a second period, in which the first period and the second period are periods of one or more pulse width modulation cycles, in which a polarity of the voltage across the second winding in the second period is opposite to a polarity of the voltage across the second winding in the first period;

receiving 310 second voltage samples from the first winding in the second period; and determining 312 a position of the rotor based on a difference between the first voltage samples and the second voltage samples.

Use of the method 300 may address at least some of the problems encountered with the alternative methods of low speed rotor position detection. The technique does not need to use high frequency current injection; it is based on floating phase voltage sampling, and using of the phase tracking observer. In this way, fine estimation of the rotor position and speed with increased angle resolution over the 360 electrical degrees may be obtained. This fulfils the sampling theorem requirement (sampling frequency must be 2 times higher than the mechanical dynamic cutting frequency)—which enables stable speed and position control at very low speed ranges.

Various example circuits and steps in accordance with the method are described below with reference to FIGS. 4 to 8. FIGS. 9 and 10 provide example implementations of a multiphase synchronous motor circuit in which the controller has a modular arrangement.

FIGS. 4a-4d relate to an example of a multiphase synchronous motor circuit with a controller 402 that is configured to provide stand-still to low-speed rotor position detection using a method in accordance with that described with reference to FIG. 3. In this way, a sensorless low speed synchronous motor controller with tracking observer may be provided. The rotor position estimation is based on mutual inductance phenomena, which is rotor position dependent. The motor is controlled with an inverter module based on six step control with bipolar PWM (pulse width modulation) control, and optionally with a vector control enhancement. The technique is suitable for synchronous motor especially PMSM, BLDC or Synchronous reluctance motors.

Figure 4A:
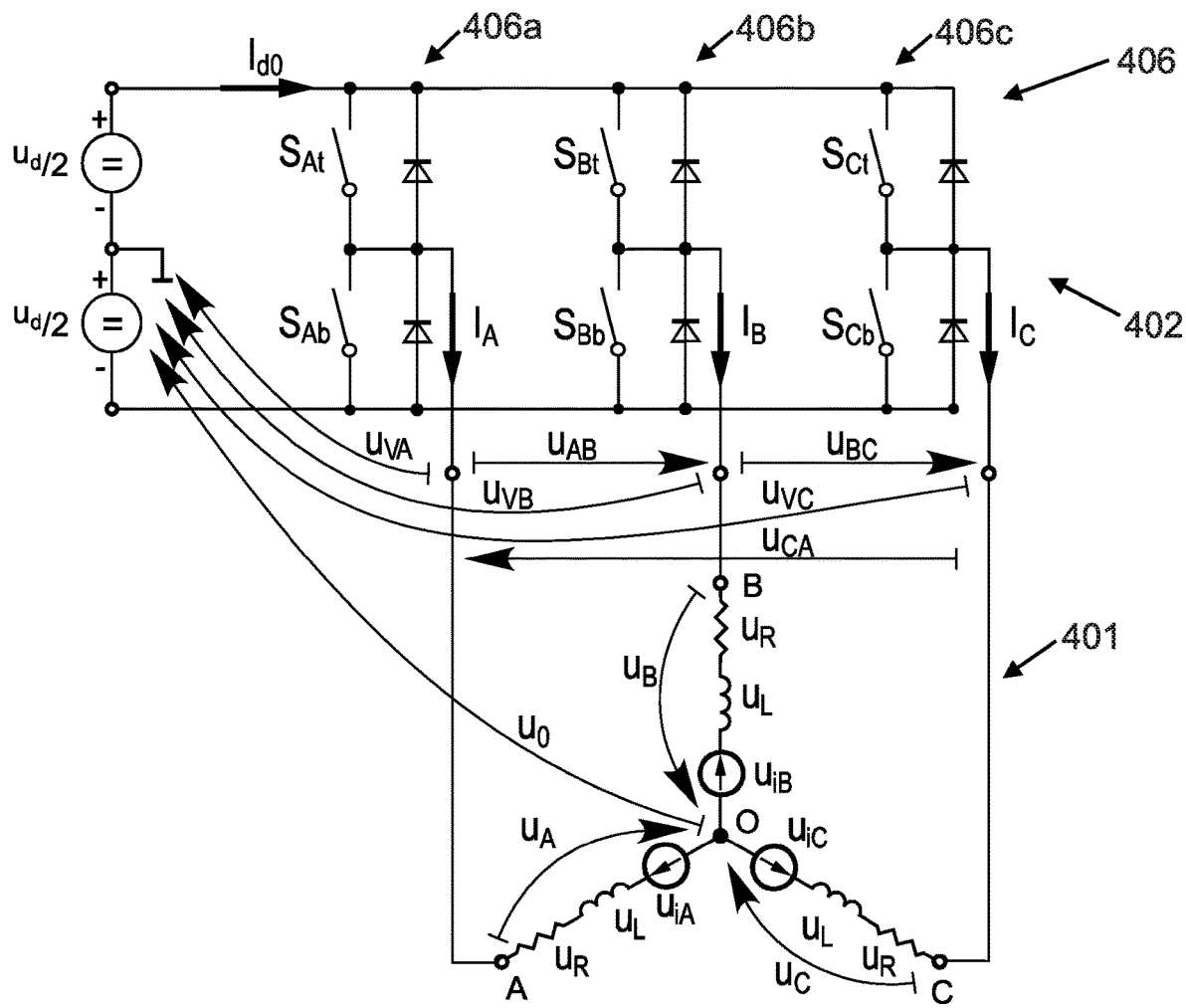
FIG. 4a illustrates an example circuit diagram for a multiphase synchronous motor.

FIG. 4a illustrates an example circuit diagram for a multiphase Brushless DC motor (or PMSM) circuit with a controller 402 and a motor 401.

The motor 401 is a three phase motor with three driving stator windings: winding A, winding B and winding C. The three windings each have a first connection and a second connection. The respective second connections of the three windings are coupled together. The respective first connections of the windings A, B, C are connected to a plurality of switches 406 of the controller 402. The plurality of switches is arranged into a number of switching units 406a, 406b, 406c. Each switching unit 406a, 406b, 406c comprises a first switch (top switch) and a second switch (bottom switch). In each respective switching unit 406a-c, the first switch and the second switch are provided in series between a first power rail and a second power rail. A free-wheeling diode is provided in parallel with each of the first and second switches. A node is provided at a point between each of the first and second switches. The respective nodes are connected to the second connections of the windings, so that each of the windings is associated with one of the switching units 406a-c.

The controller 402 in this example is configured to control the plurality of switches 406 in order to set the motor 401 in accordance with the method described with reference to FIG. 3 for a vector as previously described with reference to FIGS. 1a and 1b. In order to provide speed/torque control to the motor 401, the application of each vector may be subject to a pulse width modulation scheme (PWM). The plurality of switches 406 may therefore be controlled in accordance with the PWM scheme in order to provide a PWM signal to each of the windings a-c that are subject to the application of a voltage for inducing a particular stator flux vector.

Figure 4B:
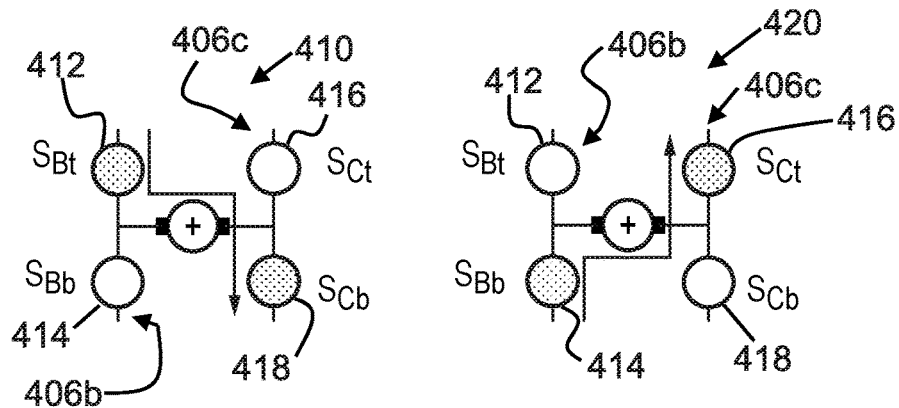
FIG. 4b illustrates a state diagram for a PWM cycle having a first state and a second state.

FIG. 4b illustrates a state diagram for a PWM signal having a first state 410 and a second state 420. FIG. 4a shows the states of the switching units 406b, 406c associated with windings B and C during the application of a particular vector. During the application of this particular vector, a non-zero voltage is applied across windings B and C, and winding A is at a floating potential. That is, both the first and second switch of the switching unit 406a associated with winding A are open.

In the first state 410 illustrated in FIG. 4b, the first switch 412 of the switching unit 406b associated with winding B and the second switch 418 of the switching unit 406c associated with winding C are closed, and the second switch 414 of the switching unit 406b associated with winding B and the first switch 416 of the switching unit 406c associated with winding C are open so that a voltage with a first polarity is provided across windings b and c.

In the first state 410 illustrated in FIG. 4b, the first switch 412 of the switching unit 406b associated with winding B and the second switch 418 of the switching unit 406c associated with winding C are open, and the second switch 414 of the switching unit 406b associated with winding B and the first switch 416 of the switching unit 406c associated with winding C are closed so that a voltage with a second polarity is provided across windings b and c. The second polarity opposes the first polarity.

Figure 4C:
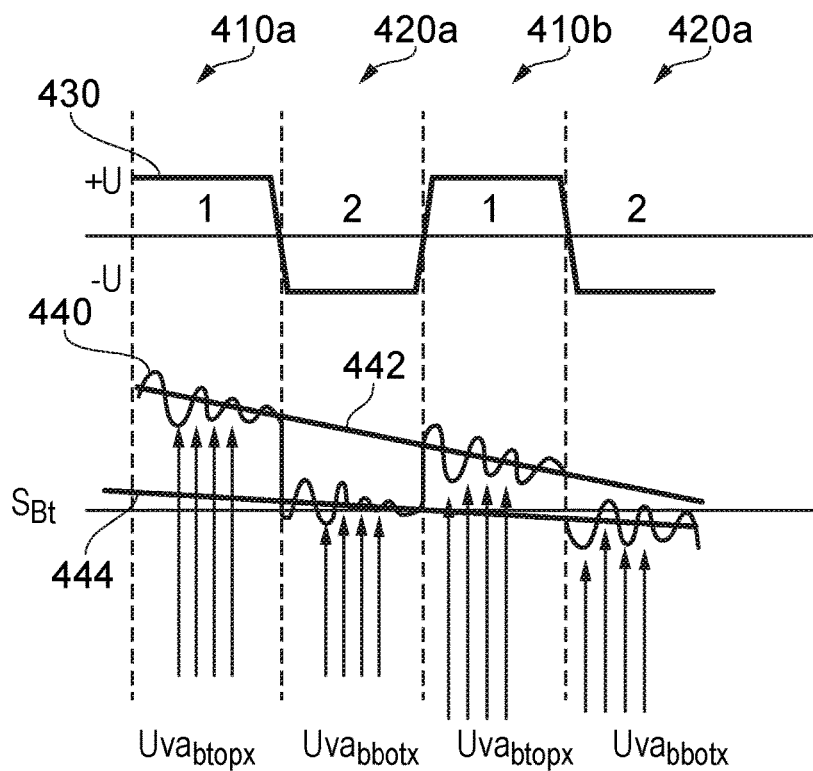
FIG. 4c illustrates a voltage across a floating winding during application of the PWM signal described previously with reference to FIG. 4b.

FIG. 4c illustrates a voltage $U_{vb}$ across winding B during application of the PWM signals of the example vector described previously with reference to FIG. 4b, and a corresponding voltage $U_{va}$ that may be determined from floating winding A during the application of the PWM scheme.

Two complete PWM cycles are shown. Each cycle has a first period in the first state 410a, 410b and a second period in the second state 420a, 420b. The duty cycle of the respective periods determines the average voltage vector applied to the rotor by the PWM cycle. The average voltage vector determines the current in the winding B and resulted torque applied to the rotor. During the first state 410a, 410b of the PWM cycle, a positive voltage +U is provided across winding B. During the second state 420a, 420b of the PWM cycle, a negative voltage −U is provided across winding B.

A voltage 440 is induced on floating winding A during the PWM cycle. The voltage 440 is oscillatory in nature due to mutual capacitive effects between phases and semiconductor switching parasitic phenomena, which are independent of rotor position. The voltage 440 also varies linearly, depending on the position of the rotor, among other factors. As shown in FIG. 4c, the average envelope 442 of the voltage 440 during the application of the first state 410a, 410b is different from the envelope 444 of the voltage 440 during application of the second state 420a, 420b. The voltage 440 during the PWM cycle can be used to determine the position of the rotor due to the relationship between the inductive component and rotor position.

In the example described with reference to FIGS. 4B and 4C:
 winding A of the motor is set to a floating state in which it is electrically floating;
 a voltage $+U_{BC}$ across windings B and C is set in a first state 410a, 410b of the PWM cycle;
 a plurality of first voltage samples $U_{va}$ are received from winding A during the first state 410a, 410b of the PWM cycle;
 a voltage $-U_{BC}$ across windings B and C is set in a second state 420a, 420b of the PWM cycle, in which a polarity of the voltage $-U_{BC}$ across windings B and C in the second state is opposite to a polarity of the voltage $+U_{BC}$ across windings B and C in the first state;
 a plurality of second voltage samples $U_{va}$ are received from winding A during the second state 420a, 420b of the PWM cycle.

A position of the rotor may be determined based on a difference between the first and second voltage samples. In this example, the voltage of the floating phase may be processed with a digital sampling filter that is synchronized with bipolar PWM signal according to:

$$U_{amut} = \Sigma_{i=0}^{n} U_{atop\,i} \cdot c_{ti} + \Sigma_{i=0}^{n} U_{abot\,i} \cdot c_{bi} \qquad (1)$$

where, $U_{atop}$ is a voltage sample taken during the first state of the PWM cycle, $U_{abot}$ is a voltage sample taken during the second state of the PWM cycle, n is the number of samples in the respective plurality of first and second voltage samples, c are coefficients which may vary depending on which phase is the floating phase, scaling or filter implementation. $U_{amut}$ is a mutual inductance position dependant signal.

In this way, the filter compensates for mutual capacitance and other effects in the voltage of the floating phase, which are not position dependent, resulting in the mutual inductance position dependant signal $U_{amut}$.

It is unimportant whether the first and second voltage samples or if one is subtracted from the other; both operations have the effect of providing a signal that contains the difference between first and second voltage samples.

In one example, when the coefficients, $c_{ti}$, for the first state 410a, 410b are of different from the coefficients, $c_{bi}$, for the second state 420a, 420b and the number of samples, n, obtained during the first state 410a, 410b is the same as the number of samples, n, (although this need not be the case) obtained during the second state 420a, 420b. However, a combination of other coefficients can also be used to determine the rotor position dependent signal, in which back-EMF and mutual capacitance effects are suppressed.

Figure 4D:
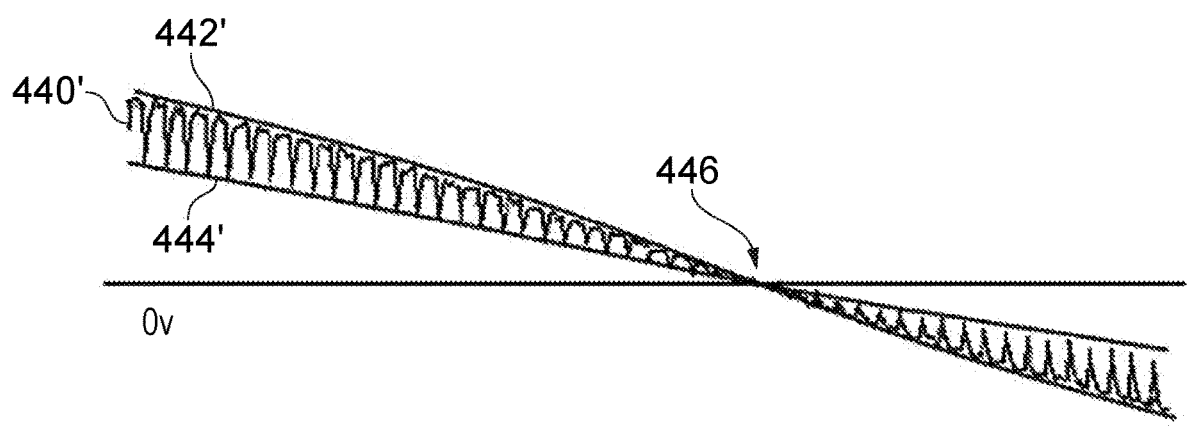
FIG. 4d illustrates a voltage across a floating winding during application of a plurality of PWM cycles described previously with reference to FIG. 4b.

FIG. 4d illustrates a voltage 440' across a floating winding during application of a plurality of the PWM cycles described previously with reference to FIG. 4b. In contrast to the previously discussed examples in which the zero-point crossing 446 of the voltage 440' on the floating winding was used to determine a position of the rotor, a controller implementing the method of FIG. 3, such as the controller 402, is able to determine a position of the rotor for each of the PWM cycles, not only the zero-point crossing. The position of the rotor may therefore be determined more frequently, which may enable improved control of rotor commutation in some applications.

In various applications of the controller described with reference to FIG. 4 it is notable that:

1) Synchronous motor control may be enabled without sensors (no sincos nor incremental encoder nor other position and speed sensors).
2) Stable motor rotation with speed or position control may be obtained at a speed below 5% of a nominal speed of the motor, without using high frequency injected current noise.
3) The PWM signals applied to the motor at the low speed range may use six step bipolar control pattern with one phase off, optionally with the all phase on transient between steps. That is, with a smooth vector transition between two of the six step vectors commutation. The smooth vector transition provided by a current vector angle position move of 60 degrees (using Space Vector Modulation or sinusoidal PWM signals, for example). At the transient, the all phases are powered.

increases roughly lineally from a negative value at +30° to a positive value at +90°. In a fourth sector (V4, sect 4), in which a voltage is dropped across windings C and A and winding B is floating, the signal 600 decreases roughly lineally from a positive value at +90° to a negative value at +150°. In a fifth sector (V5, sect 5), in which a voltage is dropped across windings C and B and winding A is floating, the signal 600 increases roughly lineally from a negative value at +150° to a positive value at −150°. In a sixth sector (V6, sect 6), in which a voltage is dropped across windings A and B and winding C is floating, the signal 600 decreases roughly lineally from a positive value at −150° to a negative value at −90°.

Figure 6:
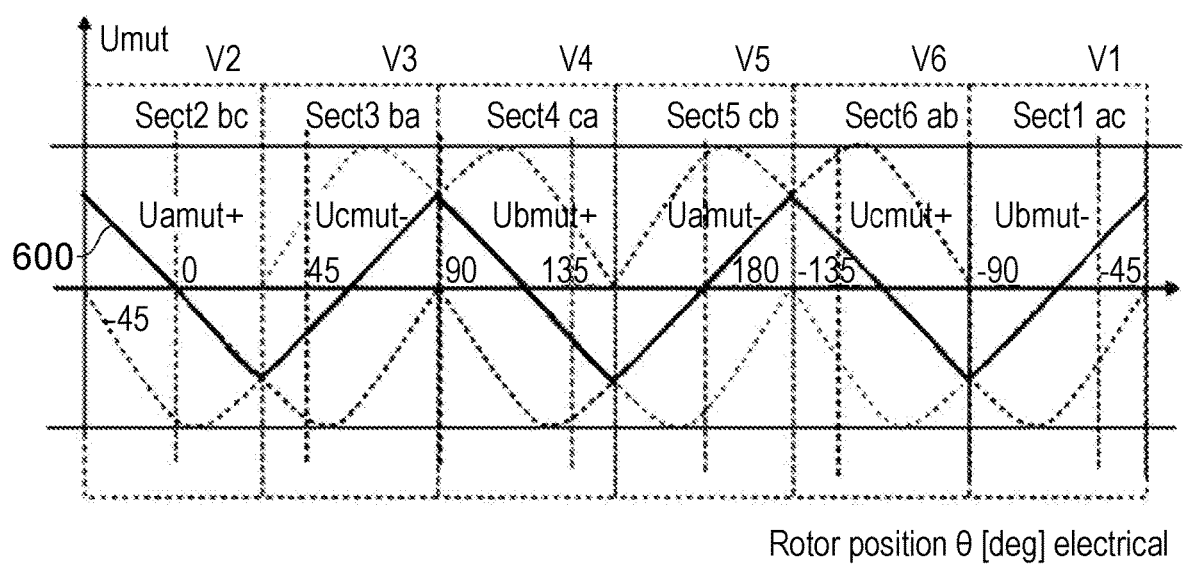
FIG. 6 illustrates an inductance position dependent signal as a function of rotor position during a six vector cycle.

The relation between energized phases vector, measured floating phase, sector, six step electrical angle and expected rotor angle illustrated in FIG. 6 is also described in Table 1.

TABLE 1 six step sector (vector) and electrical angle table

| Energized Phases (Vector) | +A, −C (V1) | +B, −C (V2) | +B, −A (V3) | +C, −A (V4) | +C, −B (V5) | +A, −B (V6) |
|---|---|---|---|---|---|---|
| Measured Phase | X = −B | X = A | X = −C | X = +B | X = −A | X = +C |
| Measured Signal | $-U_{bmut}$ | $U_{amut}$ | $-U_{cmut}$ | $U_{bmut}$ | $-U_{amut}$ | $U_{cmut}$ |
| Sector | 1 | 2 | 3 | 4 | 5 | 6 |
| Electric Angle | 30 | 90 | 150 | −150 | −90 | −30 |
| Expected Rotor Position Angle | (−90, −30) | (−30, 30) | (30, 90) | (90, 150) | (150, −150) | (−150, −90) |
| Initialization Angle | 30 | 90 | 150 | −150 | −90 | −30 |

FIG. 5 illustrates the inductance position dependant signal $U_{amut}$ as a function of rotor position θ. The signal $U_{amut}$ is dependent on rotor position against the floating phase X (phase A in this example). The first harmonic is sinusoidal of doubled electrical rotor position sin(2*θ). The signal has also some higher order harmonic content.

As discussed above, FIGS. 4a-4c illustrate features of a PWM cycles for one out of six step vectors (B, C) applied to the motor. As depicted in FIG. 1, there are six vectors over one electrical revolution. The vectors may be commuted according to rotor position (angle). The vector is related with sector, and the floating phase measured voltage is selected (after the floating phase Commutation current decay) according to the applied vector/sector. The situation at ideal vector commutation (provided by controller) dependence between estimated rotor position is displayed in FIG. 6. It depicts the applied vectors/sectors and measured phase signals Uamut+, Ubmut+, Ucmut+, Uamut−, Ubmut−, Ucmut−.

FIG. 6 illustrates the inductance position dependent signal 600 $U_{xmut}$ as a function of rotor position during a six vector cycle of a three phase motor. In a first sector (V1, sect 1), in which a voltage is dropped across windings A and C and winding B is floating, the signal 600 increases roughly lineally from a negative value at −90° to a positive value at −30°. In a second sector (V2, sect 2), in which a voltage is dropped across the B and C windings in series and winding A is floating, the signal 600 decreases roughly lineally from a positive value at −30° to a negative value at 30°. In a third sector (V3, sect 3), in which a voltage is dropped across windings B and A and winding C is floating, the signal 600

Figure 7:
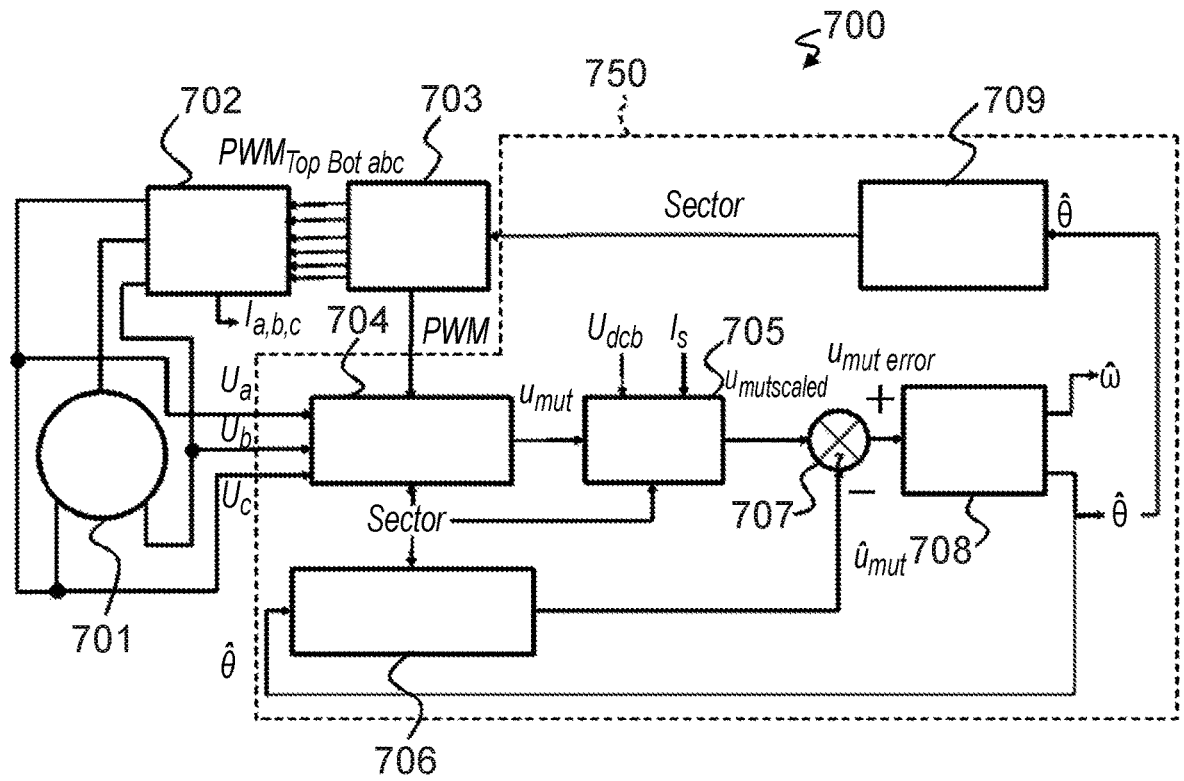
FIG. 7 illustrates a schematic block diagram of another multiphase synchronous motor circuit.
Figure 8:
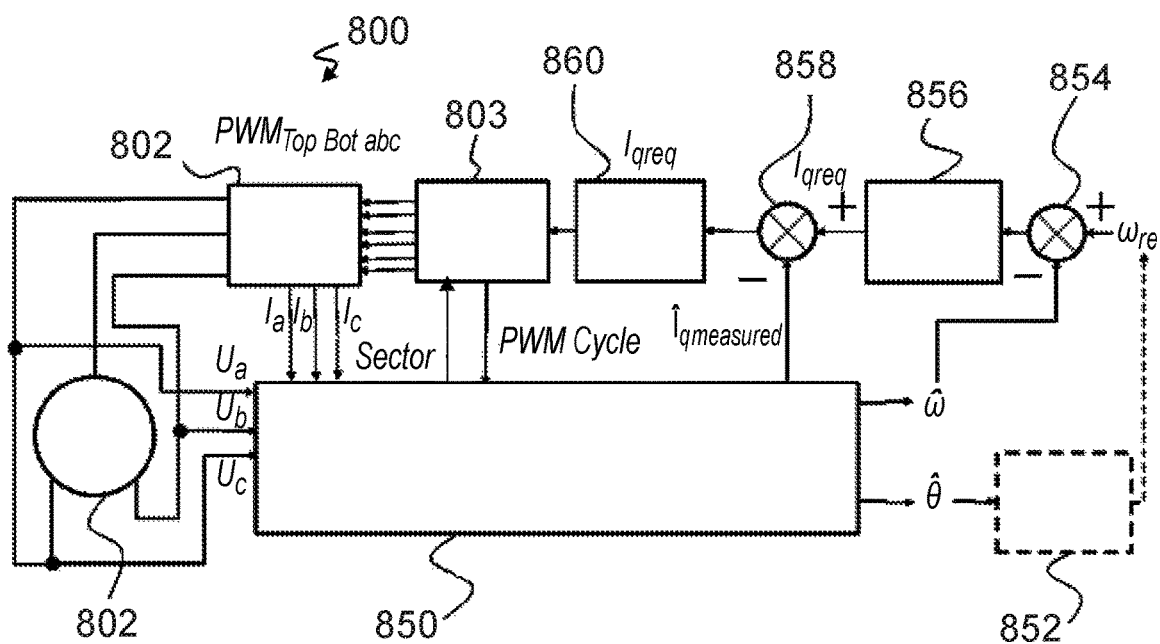
FIG. 8 illustrates a schematic block diagram of a further multiphase synchronous motor circuit.
Figure 9:
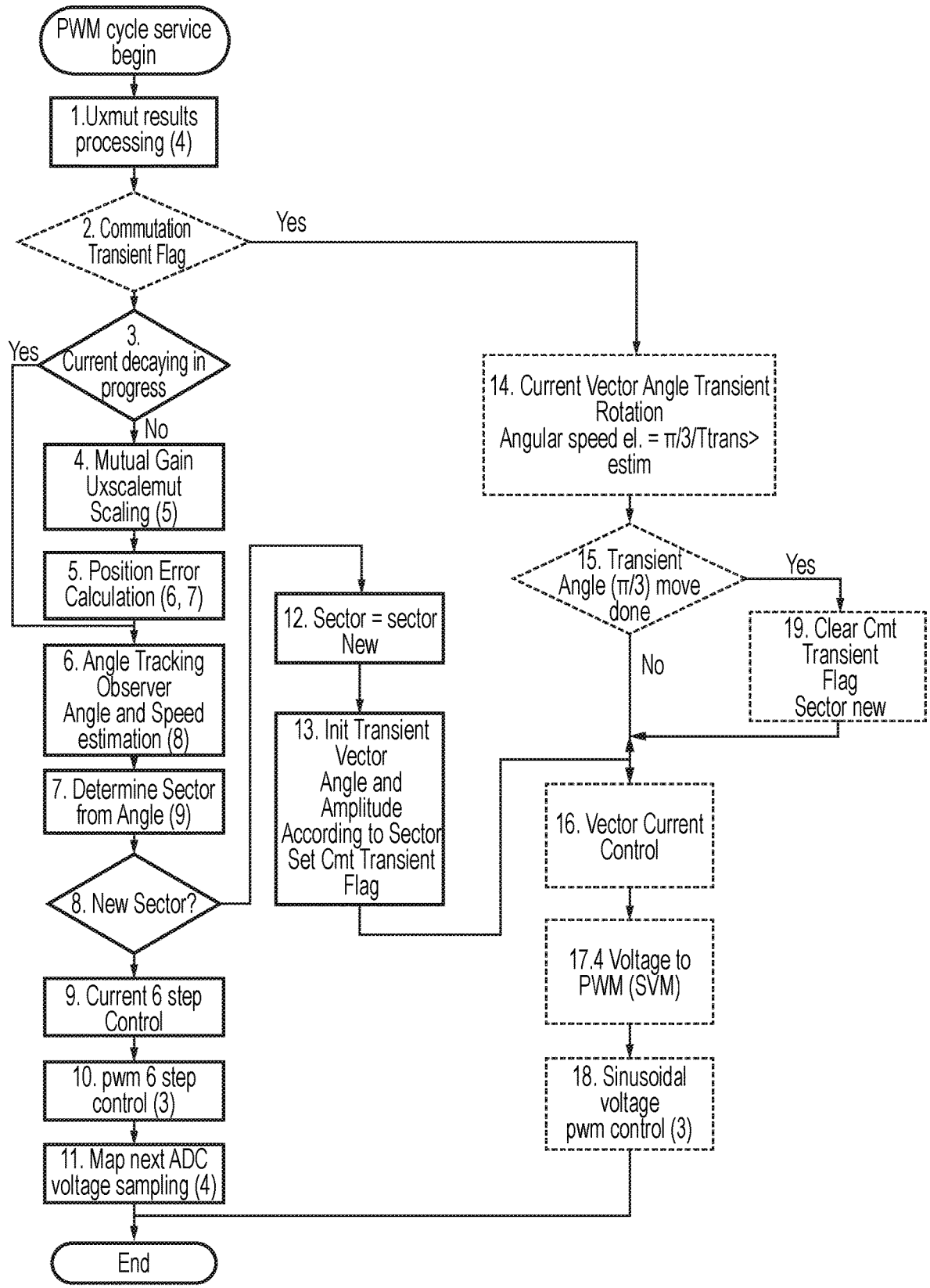
FIG. 9 illustrates a method of operating a controller for a multiphase synchronous motor.

FIGS. 7 and 8 illustrate schematic block diagrams for multiphase synchronous motor circuits 700; 800. Each circuit 700; 800 comprises a multiphase synchronous motor 701; 801, an invertor 702; 802 and a pulse width modulator module 703, 803, which may be operated in a substantially conventional fashion. In addition, the circuits 700; 800 comprise low speed position estimation current processing modules 750; 850 that are configured to perform rotor position detection at low motor speeds. Commutation of the motor is controlled in accordance with the detected position using the respective PWM module 703; 803 and invertor 702; 802 in accordance with the determined position of the rotor.

In the circuit 700 illustrated in FIG. 7, the additional control modules 750 include a digital sampling filter 704. The functionality of the digital sampling filter 704 was described previously with reference to FIG. 4 and by formula (1).

A scaling module 705 receives a signal from the digital sampling filter 704 and provides a scaled signal to a summator 707. The inductance position dependent signal, or mutual signal, $U_{xmut}$ amplitude is linearly dependent on power stage DC voltage $U_{dcb}$ and is also dependent on motor current amplitude is, which reflects the magnetic circuit saturation effects. For correct position information, the mutual voltage is scaled with a gain for a measured phase X:

$$\text{gain}_x = U_{dcb} \cdot f_x(i_s) \qquad (2)$$

where the x is one of the measured phases A, B, C. The function $f_x$ can be implemented with a table, piecewise linear or polynomial function. The mutual scale correction module voltage, $U_{xscalemut}$:

$$U_{xscalemut} = \frac{U_{xmut}}{gain_x} \quad (3)$$

This is provided by the scaling block 705. The block 706 provides the estimated position determination signal $\hat{U}_{amut}$. The estimated rotor position function may be shifted according to the sector with a dedicated voltage inducing a stator flux vector and measured phase, for example:

$$f_{sector}(\hat{\theta}) = \text{sgn}(sector^2) \cdot f_{mut}(\hat{\theta} - (sector-2) \cdot \pi/3) \quad (4)$$

The function $U_{amut}$ is a sinusoidal function with some harmonic. In this example, it is measured when the sector is 2. Therefore, the estimated $\hat{U}_{amut}$ may be calculated using the function:

$$\hat{U}_{amut} = f_{mut}(\hat{\theta}) = gain \cdot (-c_1 \cdot \sin(2 \cdot \hat{\theta}) + c_2 \cdot \sin(2 \cdot (2 \cdot \hat{\theta} + \theta_{2offset}))) \quad (5)$$

where $c_1$ and $c_2$ are constants. $f_{mut}(\hat{\theta})$ can be simplified using linearization:

$$\hat{U}_{amut} = f_{mut}(\hat{\theta}) = gain \cdot (-k) \cdot \hat{\theta} \quad (6)$$

where k is a constant.

Scaled signal is mixed by the summator 707 with the output of a position determination signal estimation block 706. The error between estimated and measured position determined signals from the summator 707 may be processed by the tracking observer 708, using, for example, an angle tracking algorithm known in the art. Tracking observer gives the rotor position and speed information, which can be updated at each filter sample instant. The sampling period can be as low as the inverter PWM period (usually sampling period 10 kHz each PWM or each second PWM). The rotor which is fed back to the position determination signal estimation block 706. The position of the rotor is also fed forward to a sector determination block 709. Using the estimated angle $\hat{\theta}$ from the observer, the commutation sector determination 709 is able to determine the required sector according to a look-up table, such as table 1, to controls commutation of the motor via the PWM module 703.

In the circuit 800 illustrated in FIG. 8, the additional control modules 840 include a low speed position estimation current processing module 850 and provided to a position controller 852. A required speed is generated by the position controller in accordance with the position of the rotor. A speed of the rotor is also provided by the low speed position estimation current processing module 850, and provided to a first summator 854, which calculates error between the estimated speed and the required speed. The Error signal-Output from the summator 854 is provided to a speed controller 856. A current error ($I_{qreq} - \bar{I}_{qmeasured}$) from the speed controller is provided to a summator 858, where it is summed with a signal from the low speed position estimation current processing module 850. Output from the second summator 858 is provided to a current controller 860, which provides a signal for the PWM module 803.

FIG. 9 illustrates a method for determining the position of a rotor, which may be performed by the controllers described previously with reference to FIGS. 4, 7 and 8, for example.

The process is executed each period of a PWM cycle. The results of dedicated floating measured phase are processed according to formula (1) digital sampling filter. During switching between the control sector, the $U_{xmut}$ measured signal information is not valid due to current decaying. When the decaying is finished the $U_{xmut}$ signal is scalled according to formula (3). The position error is calculated in process 5 according to formula (4) and (6) (or optionally 5). The tracking observer estimates the rotor angular position $\hat{\theta}$. The rotor position sector is determined based on the expected rotor angle according to Table 1. When a new sector request is identified from the rotor position $\hat{\theta}$ a commutation to a new sector is provided. The process 5 calculates the control algorithm current control. This may be implemented as PI controller and used for internal loop of a speed control. The pwm 6 step control provides PWM signals according to a dedicated sector, required voltage Ureq and FIG. 1.

The PWM signals may be generated in accordance with the schedule in Table 2, for example. The PWM0 quantity in Table 2 relates to the output of a current controller, such as the current controller 860 described previously with reference to FIG. 8.

TABLE 2

(Six) Step Vector PWM Generation table

| Sector | 1 | 2 | 3 | 4 | 5 | 6 |
|---|---|---|---|---|---|---|
| Energized Phases (Vector) | +A, −C | +B, −C | +B, −A | +C, −A | +C, −B | +A, −B |
| PWMA Duty Cycle | PWMA = 0.5*(1 + PWM0) | Off | Inverted PWMA = 0.5* (1 − PWM0) | Inverted PWMA = 0.5* (1 − PWM0) | Off | PWMA = 0.5* (1+ PWM0) |
| PWMB Duty Cycle | Off | PWMB = 0.5* (1+ PWM0) | PWMB = 0.5* (1+ PWM0) | Off | Inverted PWMB = 0.5* (1 − SVMB) | Inverted PWMB = 0.5* (1 − SVMB) |
| PWMC Duty Cycle | Inverted PWMC = 0.5*(1 − PWM0) | Inverted PWMC = 0.5* (1 − PWM0) | Off | PWMC = 0.5* (1 + PWM0) | PWMC = 0.5* (1 + PWM0) | Off |
| Initialization Angle | 30 | 90 | 150 | −150 | −90 | −30 | current processing module 850, which provides functionality similar to that described with reference to units 704 to 708 in FIG. 7. A position of the rotor is determined by the Optionally, a smoother transient (commutation) between the 6 step commutations may be provided, as provided by steps 2 and 13 to 19 in FIG. 9. This vector control enhancement feature is especially suitable for a PMSM motor to eliminate commutation noise. The result of application of the vector control enhancement to a PMSM is a hybrid six step/sinusoidal PMSM controller.

In this example, a vector transient state is introduced. During the transient state, the current vector is gradually rotated by 60 electrical degrees (π/3) (see steps 14 and 15 of FIG. 9).

Processes 16, 17 and 18 of FIG. 9 provide current vector control using Space Vector or sinusoidal PWM, where all motor phases may be controlled with invertor switches. The angle transient rotation may be implemented using a conventional current vector control circuit. The transient angle is generated as a transient between two vectors. PWM generation using the vector transient state may be performed according to Table 3 in order to be compatible with bipolar PWM generation of a six step control system.

In Table 2, the space vector modulation signals SVMA, SVMB, SVMC for the respective phases are created with Standard or other symmetrical Space Vector Modulation or sinusoidal PWM generation. The Standard SVM is described for example in NXP document CM4GMCLIBUG, available at https://www.nxp.com/docs/en/user-guide/CM4GMCLIBUG.pdf.

Figure 10A:
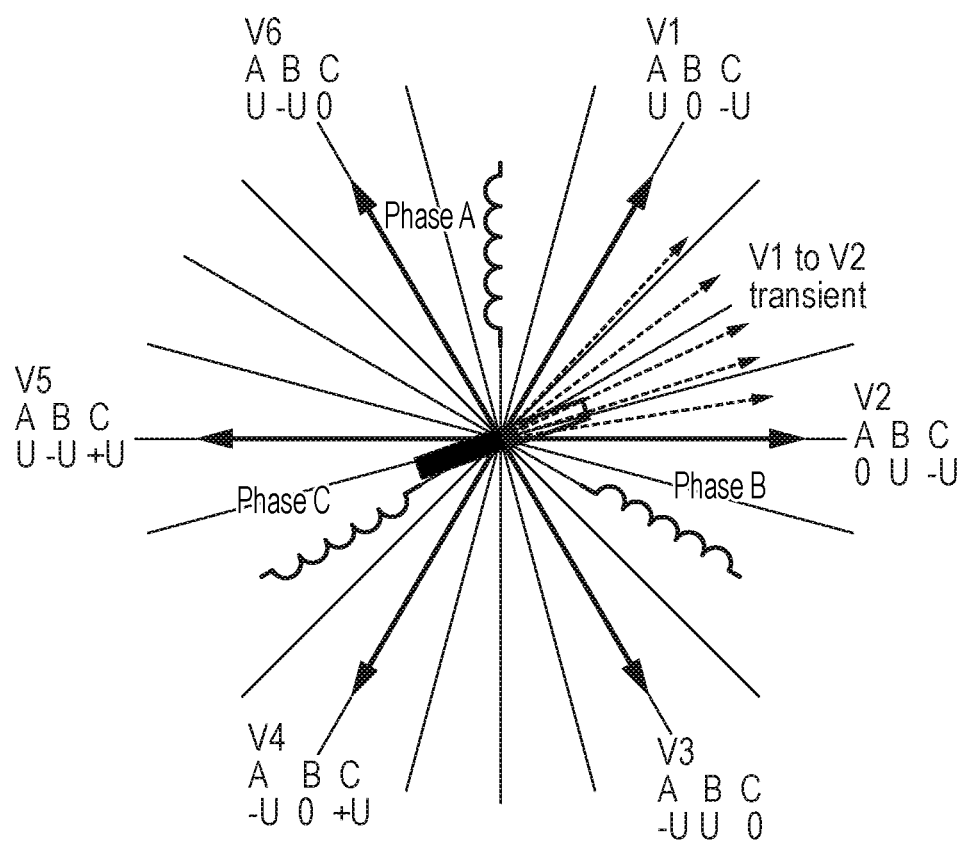
FIG. 10a illustrates a stator current and stator flux vector diagram for a three-phase synchronous motor with vector transient control.
Figure 10B:
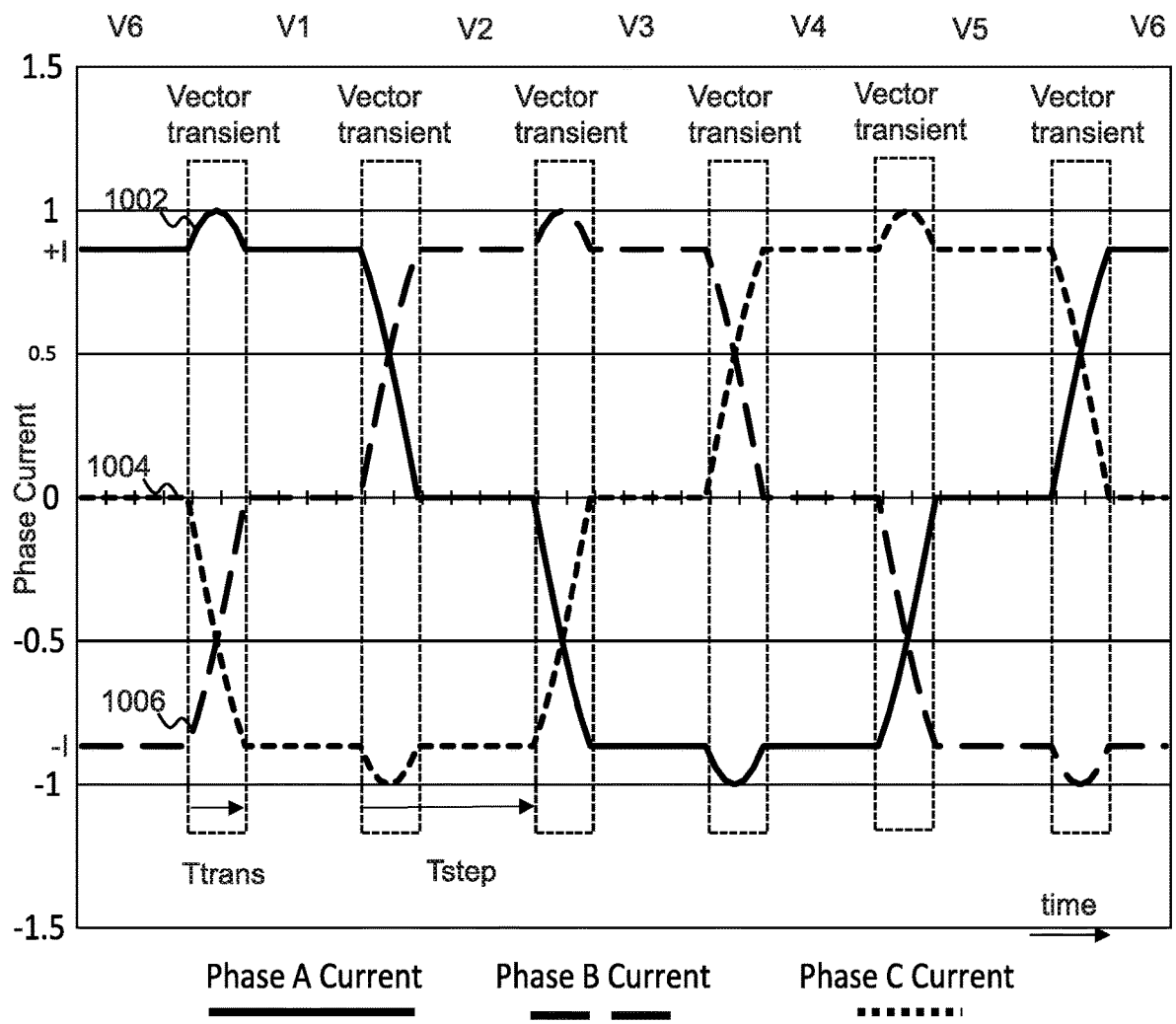
FIG. 10b illustrates a voltage against electrical angle diagram for a three-phase brushless DC motor during application of six step a stator flux vectors with vector transient control.

In the example illustrated in FIG. 10b, during application of a first vector V1 (30°), phase B is floating, phase C is at a negative current −U and phase A is at a positive current +U. During a transition from the first vector V1 to the second vector V2 (vector angle goes from 30° to 90°), the phase C may current decrease sinusoidally from −I and back to −I, and phase A and B currents transition non-asymptotically, or gradually, between 0 and +I.

During application of a second vector V2 (90°), phase B is at a positive current +1, phase C is at a negative current −I and phase A is floating. During a transition from the second vector V2 to the third vector V3 (vector angle goes from 90° to 150°), the phase B current may increase sinusoidally from +I and back to +I, and phase A and B currents transition non-asymptotically, or gradually, between 0 and −I.

During application of a third vector V3 (150°), phase B is at a positive current +1, phase C is floating and phase A is at a negative current −I. During a transition from the third vector V3 to the fourth vector V4 (vector angle goes from 150° to)−150°, the phase A current may decrease sinusoidally from −I and back to −I, and phase B and C currents transition non-asymptotically, or gradually, between 0 and +I.

TABLE 3

Six step transient and PWM table

| PWMA Duty Cycle | PWMA = SVMA | Inverted, PWMA = 1 − SVMA | Inverted, PWMA = 1 − SVMA | Inverted, PWMA = 1 − SVMA | PWMA = SVMA | PWMA = SVMA |
|---|---|---|---|---|---|---|
| PWMB Duty Cycle | PWMB = SVMB | PWMB = SVMB | PWMB = SVMB | Inverted, PWMB = 1 − SVMB | Inverted, PWMB = 1 − SVMB | Inverted, PWMB = 1 − SVMB |
| PWMC Duty Cycle | Inverted, PWMC = 1 − SVMC | Inverted, PWMC = 1 − SVMC | PWMC = SVMC | PWMC = SVMC | PWMC = SVMC | Inverted PWMC = 1 − SVMC |
| Vector/Sector | 1 to 2 | 2 to 3 | 3 to 4 | 4 to 5 | 5 to 6 | 6 to 1 |
| Electric Transient Angle | (30, 90) | (90, 150) | (150, −150) | (−150, −90) | (−90, −30) | (−30, 30) |
| Energized Phases | +a, −c | +b, −c | +b, −a | +c, −a | +c, −b | +a, −b |

FIGS. 10a and 10b generally correspond to those described previously with reference to FIG. 1, except that vector angle rotation transient control is implemented in the example of FIGS. 10a and 10b.

FIG. 10a illustrates a stator current and stator flux vector diagram for a three-phase synchronous motor with vector angle rotation transient control. The angle transient vectors from flux vector V1 into flux vector V2 are shown in FIG. 10a. Each transient vector step represents a sub-step between two vectors to provide a more gradual transition between the vectors. For a six step (three phase) motor, a vector transition provides a 60 degree change and a transient vector step represents a change of less than 60 degrees. The transition may be continuous between two adjacent vectors, as discussed below with reference to FIG. 10b.

FIG. 10b illustrates a phase currents against time diagram for a three-phase Permanent Magnet Synchronous Motor during application of six step a stator flux vectors with vector angle rotation transient control. Note that FIG. 10b relates to the stator flux vector whereas FIG. 1b described previously relates to the rotor angle, which is perpendicular to the corresponding stator flux vector. The motor has six vectors with three phases: phase A 1002, phase B 1006, and phase C 1004.

During application of a fourth vector V4 (−150°), phase B is floating, phase C is at a positive current +I and phase A is at a negative current −I. During a transition from the fourth vector V4 to the fifth vector V5 (vector angle goes from −150° to −90°), the phase C current may increase sinusoidally from +I and back to +I, and phase A and C currents transition non-asymptotically, or gradually, between 0 and −I.

During application of a fifth vector V5 (−90°), phase B is at a negative current −I, phase C is at a positive current +I and phase A is floating. During a transition from the fifth vector V5 to the sixth vector V6 (vector angle goes from −90° to)−30°, the phase B current may decrease sinusoidally from −I and back to −I, and phase A and B currents transition non-asymptotically between 0 and +I.

During application of a sixth vector V6 (−30°), phase B is at a negative current −I, phase C is floating and phase A is at a positive current +I. During a transition from the sixth vector V6 to the first vector V1 (vector angle goes from −30° to 30°), the phase A current may increase sinusoidally from +I and back to +I, and phase B and C currents transition non-asymptotically between 0 and −I.

At counteractive motor rotation direction, the transients between dedicated vectors are mirrored.

Figure 10C:
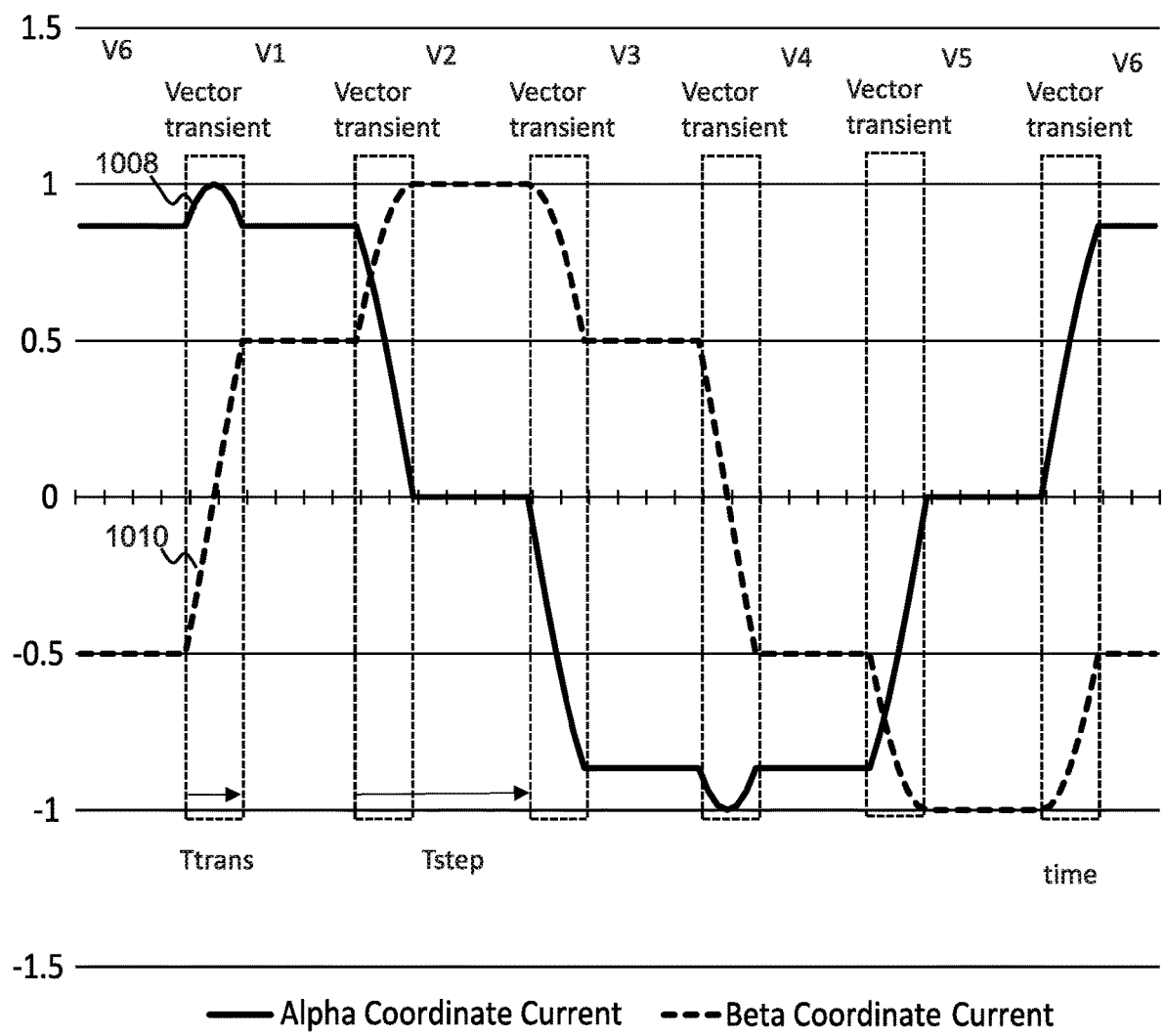
FIG. 10c illustrates current vector components $\alpha$ and $\beta$ of the planar coordinate system against time.

FIG. 10c illustrates current vector components α 1008 and β 1010 of the planar coordinate system against time diagram. FIG. 10c further illustrates how the vector transient technique of FIG. 10b may be implementation of using conventional current vector control circuit.

During the vector transients, all motor phases are driven, with invertor switches, so no phase is floating. The rotor speed and position estimation feedback is not available, (no phase switched off). In order to improve or guarantee control system stability, the transient duration Ttrans needs to be lower than the maximal speed/position control system sampling period Ts complying with sampling theorem. This means, that maximal transient period Ttrans is related with system minimal mechanical time constant. Ttrans needs to be maintained to comply Ttrans<<π*Tmech equation.

At higher rotor speed, the transient speed needs to be faster than the rotor speed. The transient duration may be adjusted (lowered) to fulfil another condition Ttrans<<Tstep, where Tstep is time of commutation (6 step) at actual angular rotor speed ω. So Ttrans<<$\theta_{step}$/(2*Π)[rad]/ω[rad/s]. For $\theta_{step}$=Π/3 for six step commutation, Ttrans<<2*Π)/(6*ω)[rad/s]. In some examples, Ttrans<(2*Π)/(4*6*ω) [rad/s]. In that case, the speed of the transient vector is four times faster than the rotor speed.

Figure 11:
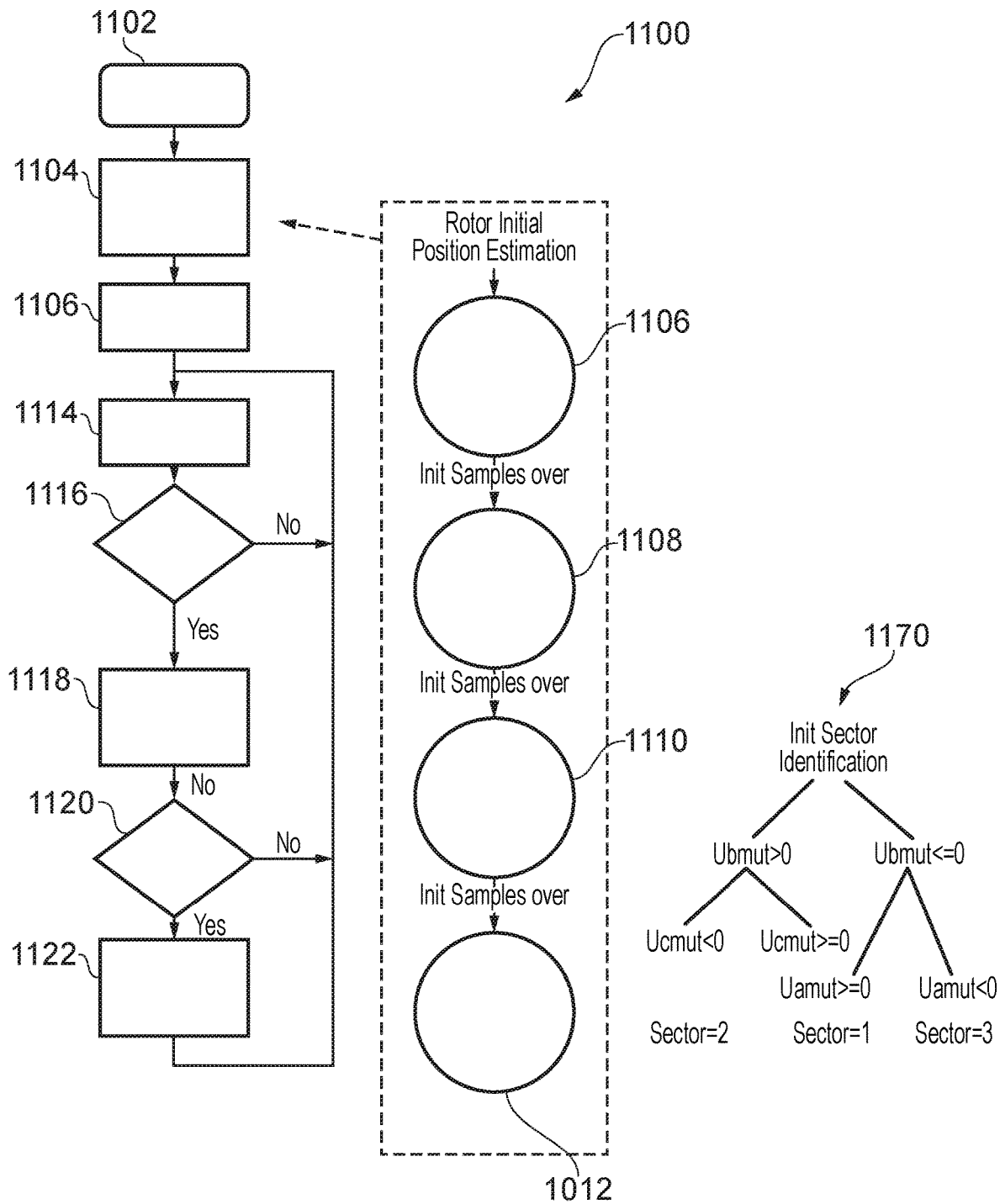
FIG. 11 illustrates a flow chart for a method of initialisation of a low speed position determination and control unit.

FIG. 11 illustrates a flow chart for a method 1100 of initialisation of a low speed position determination and control unit. At the start 1102 of the method 1100, the rotor initial position is unknown. The rotor initial position is estimated 1104 by sequentially applying three sectors of a sixth sector commutation sequence. In the rotor initial position estimation 1104, a set of signals is obtained for the first sector 1106, a set of signals is obtained for the second sector 1108 and a set of signals is obtained for the third sector 1110 in order to provide an initial sector and phase identification. For each of the three sectors, a voltage is applied for a pre-defined time with a zero current based on the signals obtained, the initial sector can be estimated 1112 by comparison with expected signals, such as those illustrated in FIG. 6 and table 1.

The determination performed in the rotor initial position estimation 1112 is also further illustrated in FIG. 11 in branch diagram 1170. If the inductance position determination voltage Ubmut is greater than zero for winding B, then it is determined whether the inductance position determination voltage Ucmut is less than zero, or greater than or equal to zero for winding C. If Ucmut is greater than or equal to zero then it is determined that the rotor is in sector 1. If it is determined that Ucmut is less than zero then it is determined that the rotor is in sector 2. If the inductance position determination voltage Ubmut for winding B is less than or equal to zero, then it is determined whether the inductance position determination voltage Uamut for winding A is greater than or equal to zero, or less than zero. If Uamut is greater than or equal to zero then it is determined that the rotor is in sector 1. If it is determined that Uamut is less than zero then it is determined that the rotor is in sector 3.

The motor can then be driven 1106 using the initial sector that has been identified. However, because the Umut function period is double the electrical rotor rotation period, it is possible that the determined sector can be 180° offset from the real position of the rotor. The probability of such a mismatch occurring is 50%. If the real position of the rotor is offset from the expected position of the rotor by 180°, then the application of signals to drive the motor in low speed operation 1114 will cause the motor to rotate in the opposite direction to the expected direction. The direction of travel of the rotor is then determined 1116 by, for example, comparing the angle or angular velocity with a threshold:

$$\hat{\omega} \cdot \text{sgn}(\omega_{required}) < -\omega_{inithreshold} \quad (7)$$

or position threshold after a time delay:

$$\theta \cdot \text{sgn}(\omega_{required}) < -\theta_{inithreshold} \quad (8)$$

If the expected direction is not the same as the desired direction then it is determined 1118 that the selected sector is 180° out of phase shifted. A wrong position flag may be set in response to the determination and checked 1120. A 180° phase shift is therefore applied 1122 if the flag is set in order to correct the direction of rotation of the motor and, according to table 1, the vector/sector is updated.

Another solution is to apply constant current alignment before the initialization. The initialization may be performed after the motor has been switched off from power. Once the motor is energized, the position estimation may be retained with the motor is at a low energy (e.g. zero voltage, zero current at zero speed).

The instructions and/or flowchart steps in the above Figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microprocessors, processor modules or subsystems (including one or more microprocessors or microprocessors), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microprocessor, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A controller for a multiphase synchronous motor with a rotor and a plurality of phases for receiving a plurality of motor vectors, the controller comprising a controller circuit configured to, for a motor flux vector:
   set a first phase of the motor to a floating state in which the first phase is electrically floating;
   set a voltage across a second phase of the motor for a first period;
   receive first voltage samples associated with the first phase in the first period;
   set the voltage across the second phase of the motor for a second period, in which the first period and the second period are periods of one or more pulse width modulation cycles, in which a polarity of the voltage across the second phase in the second period is opposite to a polarity of the voltage across the second phase in the first period;
   receive second voltage samples associated with the first phase in the second period;
   determine a position of the rotor based on the first and second voltage samples,
   wherein
   the controller circuit further comprises a digital sampling filter synchronized with a bipolar pulse width modulated (PWM) signal associated with PWM states associated with the first and second voltage samples, and
   the digital sampling filter is configured to compensate for mutual capacitance effects and provide the rotor position in accordance with a mutual inductance between the first and second phases; and
   on initialization of the motor
       obtain first and second voltage samples for three consecutive motor vectors of the plurality of motor vectors before said determining the position of the rotor,
       determine a direction of travel of the rotor by comparing an angular velocity of the rotor with a predetermined threshold, and
       apply a 180 degree correction to the position of the rotor if the determined direction of travel opposes an expected direction of travel.

2. The controller of claim 1, in which the position of the rotor is determined based on a difference between the first voltage samples and the second voltage samples.

3. The controller of claim 2, in which a plurality of first voltage samples and a plurality of second voltage samples are obtained from a single pulse width modulation cycle.

4. The controller of claim 1, in which the position of the rotor is determined based on the first harmonic of the difference between the one or more first voltage samples and the one or more second voltage samples.

5. The controller of claim 1, in which the position of the rotor is determined based on an identity of the phase that is in the floating period.

6. The controller of claim 1, wherein the controller circuit is further configured to determine the position of the rotor a plurality of times during the application of a single motor flux vector.

7. The controller of claim 1, in which the determined position takes the value of a continuous variable.

8. The controller of claim 1, wherein the controller circuit is further configured to:
   commutate the motor from a first vector to a second vector so that the second phase is set to the floating period and a third phase is set in the first and second periods;
   receive first and second voltage samples from the second phase; and
   determine the position of the rotor based on the first and second voltage samples from the second phase.

9. The controller of claim 8, wherein the controller circuit is further configured to, when commutating the motor from the first vector to the second vector, apply a gradual transition between the first and second vectors.

10. The controller of claim 1, in which the controller circuit does not inject a signal onto a phase for the purpose of measuring an induced signal on another phase.

11. A multiphase synchronous motor circuit comprising:
   the multiphase synchronous motor; and
   the controller circuit of claim 1, wherein the controller circuit comprises:
   a plurality of switches for setting periods of respective phases of the multiphase synchronous motor.

12. A method for controlling a multiphase synchronous motor with a rotor and a plurality of phases for receiving a plurality of motor vectors, the method comprising, for a motor flux vector:
   setting a first phase of the motor to a floating state in which the first phase is electrically floating;
   setting a voltage across a second phase of the motor for a first period;
   receiving first voltage samples associated with the first phase in the first period;
   setting the voltage across the second phase of the motor to a second period, in which the first period and the second period are periods of one or more pulse width modulation cycles, in which a polarity of the voltage across the second phase in the second period is opposite to a polarity of the voltage across the second phase in the first period;
   receiving second voltage samples associated with the first phase in the second period;
   determining a position of the rotor based on the first and second voltage samples,
   wherein
   said determining is performed using a digital sampling filter synchronized with a bipolar pulse width modulated (PWM) signal associated with PWM states associated with the first and second voltage samples, and
   compensating for mutual capacitance effects and providing the rotor position in accordance with a mutual inductance between the first and second phases using the digital sampling filter; and
   on initialization of the motor
       obtaining first and second voltage samples for three consecutive motor vectors of the plurality of motor vectors before said determining the position of the rotor, determining a direction of travel of the motor by comparing an angular velocity of the rotor with a predetermined threshold, and applying a 180 degree correction to the position of the rotor if the determined direction of travel opposes an expected direction of travel.

\* \* \* \* \*